(12) United States Patent  (10) Patent No.: US 7,966,110 B2
Tarchinski  (45) Date of Patent: Jun. 21, 2011

(54) HIGH-VOLTAGE VEHICLE FAULT DETECTION METHOD AND APPARATUS

(75) Inventor: James E. Tarchinski, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 633 days.

(21) Appl. No.: 12/042,418

(22) Filed: Mar. 5, 2008

(65) Prior Publication Data

US 2009/0228163 A1  Sep. 10, 2009

(51) Int. Cl.
*G06F 7/00* (2006.01)
*G05B 23/02* (2006.01)

(52) U.S. Cl. ............. 701/29; 701/22; 903/907; 318/479
(58) Field of Classification Search .................... 701/29, 701/22, 1; 324/420, 629; 318/471, 479; 180/64.5
See application file for complete search history.

(56) References Cited

U.S. PATENT DOCUMENTS

| | | | | |
|---|---|---|---|---|
| 3,249,863 A | * | 5/1966 | Wright | 324/629 |
| 4,449,080 A | * | 5/1984 | Konrad et al. | 318/139 |
| 4,992,904 A | * | 2/1991 | Spencer et al. | 361/5 |
| 6,577,024 B2 | * | 6/2003 | Kikuta et al. | 307/10.1 |
| 6,801,117 B2 | * | 10/2004 | Morris et al. | 337/401 |
| 7,242,196 B2 | * | 7/2007 | Yudahira et al. | 324/420 |
| 7,627,405 B2 | * | 12/2009 | Tarchinski et al. | 701/22 |
| 2008/0174926 A1 | * | 7/2008 | Evans et al. | 361/90 |
| 2008/0284253 A1 | * | 11/2008 | Stenfert Kroese et al. | 307/131 |

* cited by examiner

*Primary Examiner* — Thomas G Black
*Assistant Examiner* — Marthe Marc Coleman
(74) *Attorney, Agent, or Firm* — Quinn Law Group, PLLC

(57) ABSTRACT

A method includes detecting high-voltage faults, such as welded contactors or disconnected components, in a vehicle by measuring the total electrical impedance between positive and negative rails of a high-voltage bus and a ground or chassis, comparing the impedance before and after opening the contactors, and executing a maintenance response. The response includes setting an error code when the open impedance level is less than a threshold multiple of the closed impedance level. A vehicle includes a chassis, energy storage system (ESS), motor/generator, and a high-voltage bus conducting electrical current from the ESS to the motor/generator. Contactors are positioned along each of the rails of the bus, a device for measuring a total electrical impedance level between the chassis and each of the rails, and a controller for determining a welded contactor condition of at least one of the contactors based on the measured total electrical impedance level.

16 Claims, 2 Drawing Sheets

HIGH-VOLTAGE VEHICLE FAULT DETECTION METHOD AND APPARATUS

TECHNICAL FIELD

The present invention relates to a method and apparatus for detecting a fault condition aboard a vehicle having at least one contactor or relay that is operable for isolating or containing high voltage within an energy storage system.

BACKGROUND OF THE INVENTION

In a high-voltage propelled vehicle (HVPV), such as a hybrid-electric vehicle (HEV), a plug-in hybrid electric vehicle (PHEV), a fuel cell electric vehicle (FCEV), or a purely electric vehicle (EV), an energy storage system (ESS), for example a battery pack, can provide a source of at least a portion of the power necessary for propelling the vehicle. The engine or fuel cell can shut off or power down when the vehicle is idling or at a standstill in order to further conserve fuel, depending on the particular design of the vehicle. The ESS itself contains or stores relatively high voltage, which is transmitted to one or more vehicle devices, such as one or more motor/generators, via a specially configured high-voltage bus having a positive and a negative conductor or "rail". The ESS in turn is isolated from the various vehicle conductive structures and surfaces, and from the vehicle chassis itself, in part by selectively opening one or more electrical relays or contactors under certain operating conditions, such as during vehicle shutdown and/or under certain fault conditions, by opening one or more contactors.

Electrical contactors or relays serve to confine high voltage within the ESS during the vehicle shutdown process, as well as during certain fault conditions. Contactors helps to ensure that power to the load is shut off or interrupted when the contactors are de-energized. Contactors also help ensure that the high-voltage energy is transmitted to a load, such as a motor/generator, only when the contactor is properly energized or closed. However, under certain fault conditions the leads of one or more of the contactors may weld together, thus potentially rendering the contactor ineffective for its intended purpose. Therefore, the detection or diagnosis of such a welded contactor condition can be desirable, in particular for certain preventive or corrective maintenance purposes.

A normally-open contactor can help to ensure that electrical power to the load is shut off or interrupted when the contactor is de-energized, and that the high-voltage is transmitted to a load, such as the motor/generator, only when the contactor is properly energized or closed. However, under certain fault conditions the leads or contacts of one or more of the contactors can physically weld together, which in turn might affect the controllability of the flow of power from the ESS. While the presence of both welded contactors in a two-rail relay can be detected using diagnostics provided by a vehicle's control system, such diagnostics measure a drop in voltage when the contactors are opened, and require that other control modules to be active and communicating with the ESS for a predetermined period of time after the contactors are opened. Additionally, such voltage drop methods cannot detect the presence of a single welded contactor in a two-rail relay, particularly on the negative rail of a high-voltage bus. Other fault conditions, such as disconnected high-voltage vehicle components, are generally detected using communications intensive messaging processes that may be less than optimal for certain purposes.

SUMMARY OF THE INVENTION

Accordingly, a method is provided for detecting a high-voltage fault condition aboard a vehicle having a chassis, electrical isolation or impedance measurement circuitry, a pair of relays or contactors, an energy storage system (ESS), and a high-voltage bus. The method includes measuring an electrical impedance value between the high-voltage bus and the vehicle chassis, and determining whether a vehicle fault condition is present, as well as identifying the particular fault condition, depending on the value of the impedance measurement under different states or conditions of the contactor.

The method includes measuring a first total impedance level between the high-voltage bus and the chassis when the contactors are each in a closed state, and opening the pair of contactors before measuring a second total impedance level. The method then includes comparing the first and second total impedance levels, and executing a maintenance response aboard the vehicle in response to the measured impedance levels. Executing the maintenance response includes setting an error code in a controller corresponding to the fault condition when the second total impedance level is less than a threshold multiple of the first total impedance level.

The threshold multiple is a value selected from a predetermined range, which in one embodiment is approximately 4 to 6. The method includes comparing the first total impedance level to the second total impedance level by accessing a look-up table to determine the fault state, with the look-up table being indexed in part by a predetermined low range and a predetermined normal range of total impedance values for each of the closed state and the open state. The predetermined normal range of total impedance values corresponding to the closed state is approximately 0.800 to 1.50 mega ohms (MΩ) in one embodiment, and the predetermined normal range of total impedance values corresponding to the open state is approximately 3 to 5 MΩ.

Accessing the look-up table to determine the fault state or condition includes, in one embodiment, accessing a first portion of the look-up table to determine an ESS isolation fault, accessing a second portion of the look-up table to determine a welded contactor condition, accessing a third portion of the look-up table to determine a vehicle isolation fault, accessing a fourth portion of the look-up table to determine a no-fault condition, and accessing a fifth part of the look-up table to determine a disconnected high-voltage component condition.

A method of the present invention also includes diagnosing a high-voltage fault condition, such as a welded contactor, ESS isolation fault, and/or a disconnected high-voltage component, in a vehicle having a chassis, a pair of contactors, an energy storage system (ESS), and a high-voltage bus. The method includes measuring a first total impedance level between the chassis and the high-voltage bus while the vehicle is running, then commanding a shut-down of the vehicle before measuring a second total impedance level at the same location after the shut-down. The method then includes the comparison of the second total impedance level to the first total impedance level, and the setting of an error code or a data code aboard the vehicle corresponding to the fault condition when a ratio of the second total impedance level to the first total impedance level is less than a threshold ratio.

A vehicle is also provided having a chassis, an energy storage system (ESS), a motor/generator, and a high-voltage bus having a positive rail and a negative rail. The high-voltage bus conducts electrical current from the ESS to the motor/generator. The vehicle also includes a first contactor between the ESS and the at least one motor/generator along the positive rail of the high-voltage bus, a second contactor between the ESS and the at least one motor/generator on the negative rail, and a measurement circuit or device for measuring a total impedance level between the chassis and each of the positive and negative rails. A controller is in electrical communication with the measurement device, and has an algorithm for determining a high-voltage fault condition based on the total impedance level.

In another aspect of the invention, at least one of the first and the second contactors is configured as either a single-pole, single-throw relay device or as a solid-state switch.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
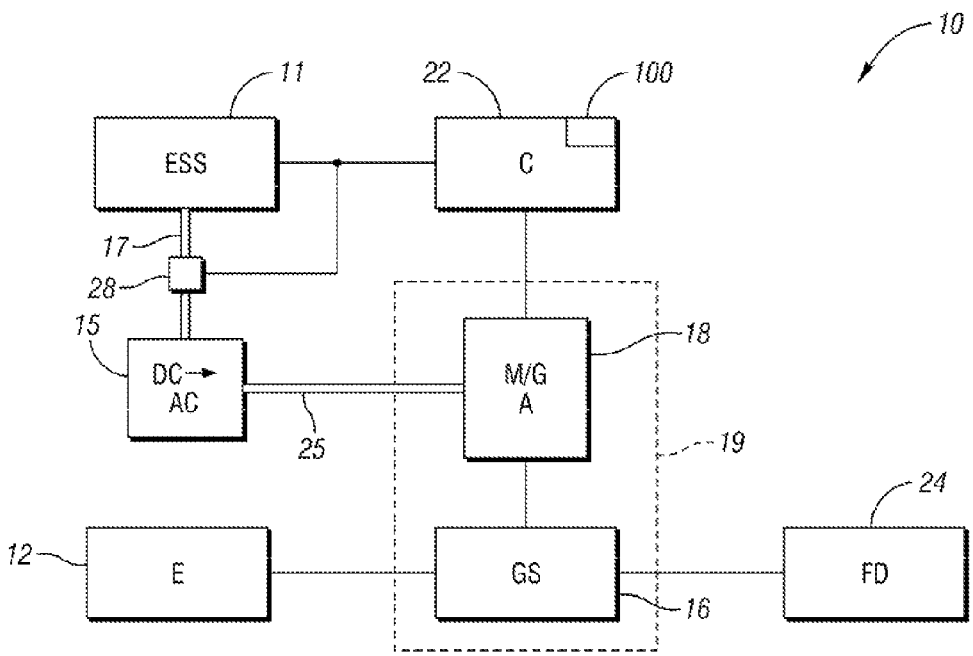
FIG. 1 is a schematic illustration of a vehicle having a controller configured for detecting a welded contactor fault condition according to the invention.

Referring to the drawings, wherein like reference numbers refer to like components, and beginning with FIG. 1, a vehicle 10 includes a controller 22 having a method or algorithm 100 for detecting a high-voltage vehicle fault condition, such as a welded contactor or contactors, a vehicle isolation fault, and/or a disconnected high-voltage component, as will be described below with reference to FIG. 3. The vehicle 10 as shown in FIG. 1 also includes an engine 12 that is selectively connectable to a transmission 19 for powering the vehicle. However, other power sources may also be used to propel the vehicle 10 within the scope of the invention, such as a fuel cell (not shown), or the vehicle 10 may be propelled exclusively via an electrical storage system (ESS) 11 if the vehicle 10 is configured as an electric vehicle. In the embodiment of FIG. 1, the transmission 19 includes one or more motor/generators 18 (M/G A) and one or more gear sets 16, such as simple or compound planetary gear sets, which are drivingly connected to a final drive assembly 24. The gear sets 16 can be selectively driven by the engine 12 and/or by the motor/generators 18. While only one motor/generator 18 is shown in the exemplary embodiment of FIG. 1, those of ordinary skill in the art will recognize that multiple motor/generators may also be used within the scope of the invention.

The ESS 11 is electrically connected to a DC-to-AC converter 15 via a high-voltage bus 17 and one or more electrical relays or contactors 28, and to the motor/generators 18. The converter 15 is in turn connected to the motor/generator 18 by an AC bus 25. When operating as a motor, the motor/generator 18 can draw electrical energy from the ESS 11, and when operating as a generator, the motor/generator 18 can generate electrical energy for storage within the ESS 11. As shown in FIG. 1, the contactor 28 is separate from the ESS 11. However, those of ordinary skill in the art will recognize that the contactor 28 and the ESS 11 may be alternately configured as a single unit.

Figure 2:
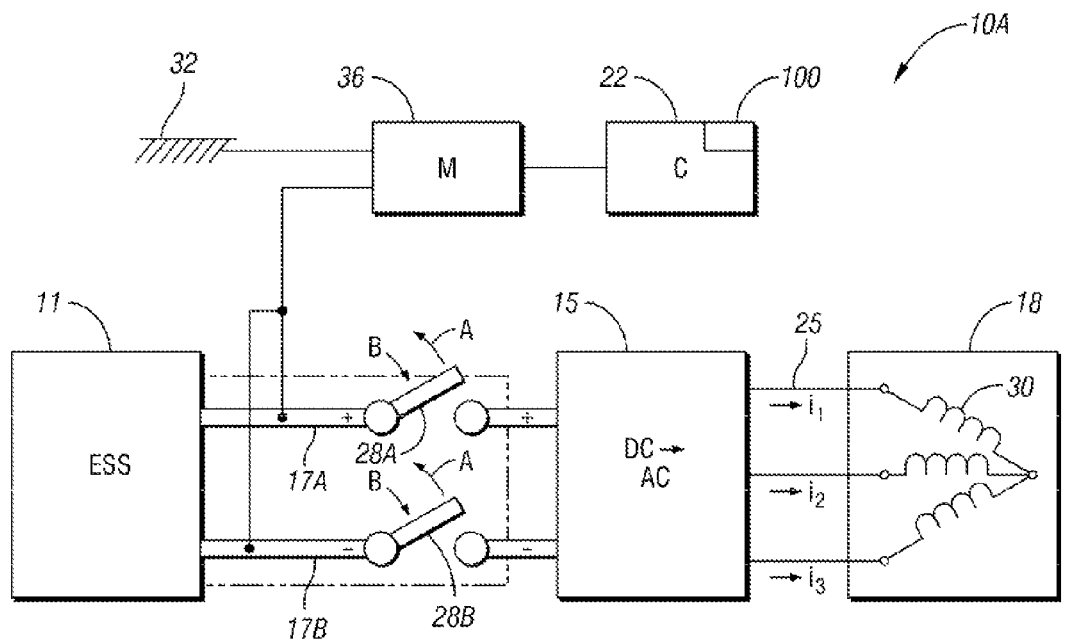
FIG. 2 is a schematic illustration of a portion of the vehicle of FIG. 1.

Referring to FIG. 2, a vehicle portion 10A of the vehicle 10 of FIG. 1 shows the ESS 11, the converter 15, and the motor/generator 18 in further detail. The controller 22 is in electrical communication with a measurement circuit or device 36, labeled "M" in FIG. 2 for simplicity. Alternately, although not shown in FIG. 2, the measurement device 36 may be functionally or physically integrated with the controller 22. The measurement device 36 is any device that is operable for measuring an electrical impedance value between the high-voltage bus 17 (see FIG. 1) and an electrical ground such as a chassis 32 of the vehicle 10 (see FIG. 1). The measurement device 36 is therefore adapted for calculating a value that is proportional to the equivalent, parallel, or total impedance levels between the rails 17A and 17B with respect to the chassis 32 (see FIG. 1), as will be described below. Alternately, the measurement device 36 is operable for separately calculating an impedance level between a respective one of the rails 17A, 17B and the chassis 32.

Additionally, each of the positive and negative rails 17A, 17B are connected to the converter 15 (also see FIG. 1), which is operable for converting the direct current (DC) voltage supplied from the ESS 11 into a three-phase alternating current (AC) voltage usable by the motor/generator 18 (see FIG. 1). The three phases are represented by the arrows $i_1$, $i_2$, and $i_3$ in FIG. 2, which are transmitted to the different inductive coils 30 of the motor/generator 18 via the conductors 25.

The contactor 28 of FIG. 1 is shown as two separate contactors 28A and 28B in FIG. 2, which may either be separate devices from the ESS 11 or, as shown in phantom, may be configured with the ESS 11 as a unit. In one embodiment, one or both of the contactors 28A and 28B are single-pole, single-throw relay devices, or alternately are solid-state switches of the type known in the art. However, other relay devices, such as a metal-oxide-semiconductor field-effect transistor (MOSFET) or an insulated gate bipolar transistor (IGBT) solid-state device, each of the type known in the art, may be used within the scope of the invention. The contactor 28A is positioned on the positive rail 17A, and likewise, the contactor 28B is positioned on the negative rail 28B. In response to the shutdown of the vehicle 10 (see FIG. 1) and/or upon the occurrence of a predetermined vehicle fault condition, each of the contactors 28A and 28B are commanded to open in the direction of arrow A, thus isolating or disconnecting the ESS 11. When the vehicle 10 is operating, the controller 22 can command the contactors 28A, 28B to close in the direction of arrow B, thus connecting the ESS 11 to the motor/generator 18 (see FIG. 1) via the high-voltage bus 17 (see FIG. 1).

Under certain circumstances, the contactors 28A, 28B may not open or break their respective electrical connection. For example, a mechanical failure such as a broken spring may prevent the contactor 28A, 28B from opening. Another possible cause is an electrical fault or control issue that might force one of the contactors 28A, 28B to either open or close with an excessive or incorrect load across its terminals or contacts, which in turn might lead to a welded contactor condition. If one or both of the contactors 28A, 28B were to fail in a closed position, the vehicle control system, such as controller 22, could lose some of its ability to contain high voltage within the ESS 11. Likewise, if the contactors 28A, 28B fail in the open position, some control functionality can be lost. By sequencing the opening and closing of each of the contactors 28A and 28B, the controller 22 can determine which contactor 28A, 28B has failed, and whether that contactor has failed in an open or a closed position.

Figures 3, 4:
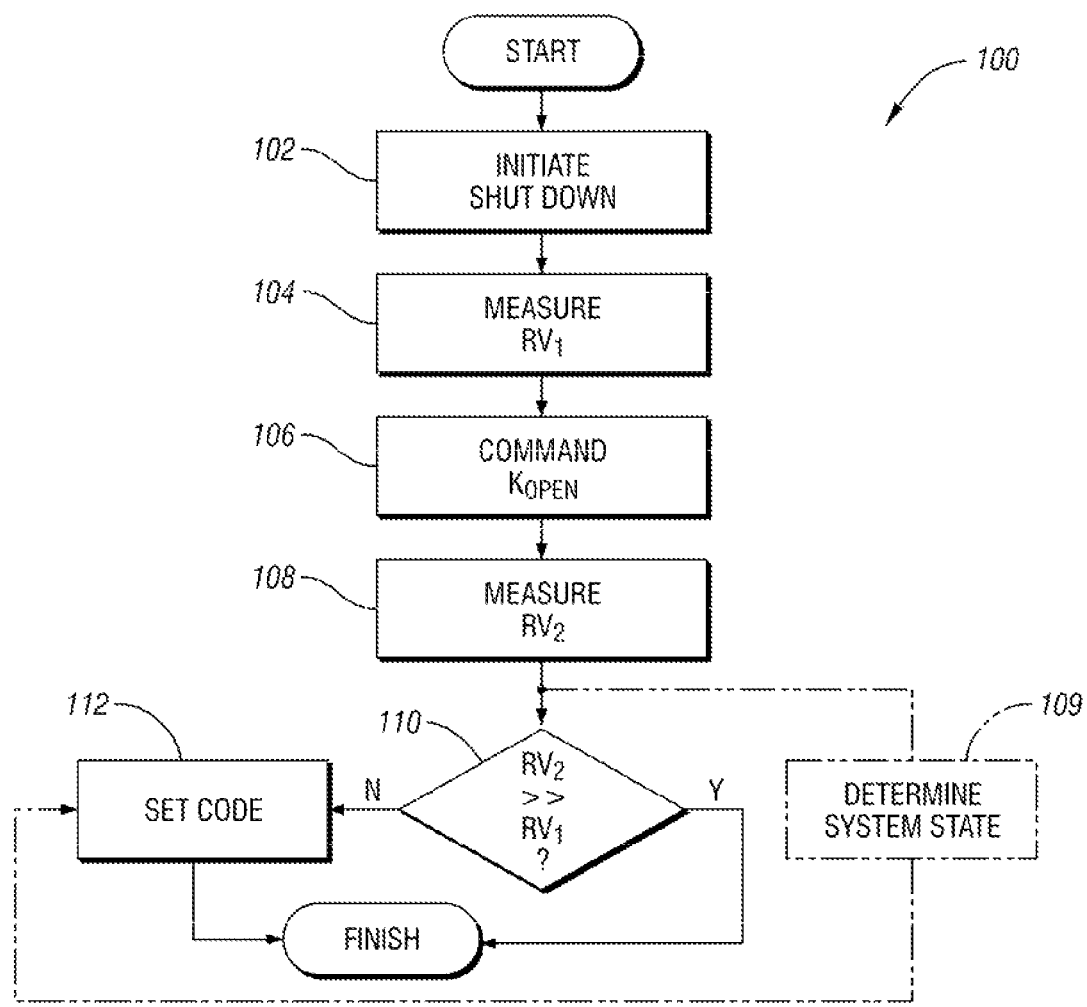
FIG. 3 is a graphical flowchart describing a method for detecting a welded contact in the vehicle of FIG. 1.
FIG. 4 is a graphical table describing various fault states or conditions aboard the vehicle of FIG. 1.

Referring to FIG. 3, the method or algorithm 100 of FIGS. 1 and 2 utilizes the measurement device 36 (see FIG. 2) to determine the first and second total impedance values ($RV_1$ and $RV_2$, respectively) between the rails 17A, 17B of the high-voltage bus 17 (see FIG. 1) and the ground/chassis 32 (see FIG. 2), to diagnose or determine the presence of a vehicle high-voltage fault condition, ESS isolation fault, or disconnected components, as described above, and to take appropriate maintenance actions in response thereto. The measurement device 36, as controlled by the controller 22, selectively measures a first total impedance value, referred to hereinafter as $RV_1$, when the contactors 28A, 28B are closed, and a second total impedance value, referred to hereinafter as $RV_2$, when the contactors 28A, 28B are open. Using the method or algorithm 100, various vehicle fault conditions can be detected, as will now be discussed with reference to FIGS. 3 and 4.

Beginning with step 102, the algorithm 100 begins in conjunction with a shutdown of the vehicle 10 (see FIG. 1), such as a normal process of turning off the engine 12 and/or the motor/generator 18 shown in FIG. 1 when an operator turns an ignition switch or key to "off", or when otherwise determined by the controller 22 (see FIG. 1). The algorithm 100 then proceeds to step 104.

At step 104, the algorithm 100 signals the measurement device 36 (see FIG. 2) to measure or otherwise determine the first total impedance value ($RV_1$). This value can be temporarily stored in a memory location of the controller 22 (see FIGS. 1 and 2), such as a circular buffer. Depending on the size of the buffer that is used, a history of impedance values may be retained for access by a maintenance probe, remote access via a telematics system, etc., depending on the design of the vehicle 10. Once the first impedance value ($RV_1$) has been properly recorded, the algorithm 100 proceeds to step 106.

At step 106, the algorithm 100 signals or commands the contactor 28 (see FIG. 1) to open. As shown in FIG. 2, in response to the command, each of the contactors 28A and 28B on the respective positive rail 17A and negative rail 17B open, i.e., move in the direction of arrow A, thus breaking the circuit between the electrical storage system (ESS) 11 and the load, such as the converter 15 and the motor/generator 18 and/or the motor/generator 20 (see FIG. 1). Once the contactor 28 (see FIG. 1) has been so signaled or commanded, the algorithm 100 proceeds to step 108.

At step 108, the algorithm 100 signals the measurement device 36 (see FIG. 2) to measure or otherwise determine the second total impedance value ($RV_2$). This value can also be temporarily stored in a memory location of the controller 22 (see FIGS. 1 and 2), such as a second circular buffer or other suitable memory device. Once the second total impedance level has been properly recorded, the algorithm 100 proceeds in one embodiment to step 109, shown in phantom, and in another embodiment to step 110.

At step 109, which is shown in phantom in FIG. 3, the algorithm 100 compares the total impedance values $RV_1$ and $RV_2$ respectively determined at steps 104 and 108, as explained above. The algorithm 100 accesses a threshold range corresponding to each of a "normal" and a "low" impedance value for each of the first and second total impedance values $RV_1$ and $RV_2$, respectively. Step 109 may be executed, for example, by accessing a look-up table that is stored within another memory location of the controller 22 (see FIGS. 1 and 2), as will now be described with reference to FIG. 4.

Referring to FIG. 4, a look-up table is indexed by the low and normal ranges corresponding to first total impedance value ($RV_1$) taken during the pre-open, i.e., closed, state of the contactor 28 (see FIG. 1), and is also indexed by the second total impedance level ($RV_2$) taken during the open state of the contactor 28 (see FIG. 1). In the exemplary embodiment shown in FIG. 4, the look-up table is therefore divided into six boxes or portions, i.e., low-low and low-normal, normal-low and normal-normal, and high-low and high-normal, with each portion corresponding to a particular predetermined fault condition aboard the vehicle 10 (see FIG. 1).

According to one embodiment, the predetermined fault conditions include an ESS fault condition (low-low), which describes a condition in which the ESS 11 (see FIGS. 1 and 2) is insufficiently isolated from the vehicle chassis 32 (see FIG. 2); a welded contactor condition (low-normal), in which one or both of the contactors 28A, 28B of FIG. 2 are welded closed, thus potentially draining energy from the ESS 11 (see FIGS. 1 and 2) and/or reducing the effectiveness of the contactor 28 (see FIG. 1); a vehicle isolation fault (low-normal), in which a short is potentially present somewhere between the high-voltage bus 17 (see FIG. 1) and the vehicle chassis 32 (see FIG. 2); and a no-fault condition (normal-normal), in which none of the fault conditions described above are indicated. The predetermined fault conditions can also include a disconnected component fault, wherein one or more high-voltage components, such as an air conditioning module, are disconnected from the high-voltage bus 17 (see FIG. 1). Such a condition is represented if the impedance value ($RV_1$) measured during the pre-open state is determined to be high, regardless of the impedance value measured during the post-open state ($RV_2$).

In one embodiment, the ranges for the pre-open state, i.e., the first total impedance level $RV_1$, are set as follows: low=less than approximately 0.6 mega ohms (MΩ), and normal=approximately 0.8 MΩ to 1.5 MΩ, with a target "normal" value of approximately 1MΩ. The limit or boundary between any low and normal range, or any normal and high range, should sufficiently varied to avoid false positive measurements. For example, if the low end of the normal range limit is set to 0.8 MΩ, a low isolation threshold point may be set to 0.6 MΩ, so as to minimize instances of "false positive" fault detection. In this embodiment, for example, the normal range for the open-state, i.e., the second total impedance level $RV_2$, can be set approximately 3 to 5MΩ, with a target of approximately 4 MΩ. However, all of these ranges are intended to be exemplary, and those of ordinary skill in the art will recognize that other ranges may be substituted in accordance with the invention. After determining the system state, the algorithm 100 proceeds to step 112.

At step 110, the algorithm 100 compares the total impedance values $RV_1$ and $RV_2$ respectively determined at steps 104 and 108, as explained above. Step 110 may be executed, for example, by accessing a stored threshold multiplier or ratio that is stored within another memory location of the controller 22 (see FIGS. 1 and 2). For example, if the second total impedance value $RV_2$ is not sufficiently larger than the first total impedance value $RV_1$, the algorithm 100 can set a flag or diagnostic trouble code (DTC) as needed.

In one exemplary embodiment, the controller 22 can be programmed with a threshold $RV_2/RV_1$ ratio range of approximately 4:1 to 6:1, i.e., a $RV_2$ to $RV_1$ multiple range of approximately 4 to 6. In this example, if the value of $RV_2$ is 2.0 MΩ and the value of $RV_1$ is 1 MΩ, the ratio of $RV_2/RV_1$ of 2:1 falls outside of the allowable threshold range of 4:1 to 6:1, and thus would result in the setting of a data code in the controller 22 at step 112, as described below. Those of ordinary skill in the art will recognize that the 4:1 to 6:1 range of ratios is exemplary, and larger or smaller ratios or multipliers may also be used within the scope of the invention by programming or setting the controller 22 accordingly. If after comparing the values of $RV_1$ and $RV_2$ at step 110, the algorithm 100 determines that the result or variance is outside of the predetermined allowable range, the algorithm 100 proceeds to step 112. Otherwise, the algorithm 100 is complete.

At step 112, the algorithm 100 executes a maintenance response aboard the vehicle 10 (see FIG. 1) in response to the first and the second impedance levels, or $RV_1$ and $RV_2$, respectively. The maintenance response can be the setting of an appropriate code or message within the controller 22 (see FIGS. 1 and 2), such as a diagnostic trouble code (DTC) or flag indicating that a particular fault has occurred aboard the vehicle 10 (see FIG. 1). For example, each fault that is diagnosed by the algorithm 100 can be assigned a unique DTC, such as a hex number, which may be pulled from the controller 22 as needed by a vehicle maintenance person, probe, or via remote telematics as needed. Other maintenance responses can include the illumination or activation of an audible and/or visible alarm or indicator lamp (not shown) within the vehicle 10 (see FIG. 1), transmission of an alarm code to a remote location, etc.

While the best modes for carrying out the invention have been described in detail, those familiar with the art to which this invention relates will recognize various alternative designs and embodiments for practicing the invention within the scope of the appended claims.

The invention claimed is:

1. A method for detecting a high-voltage fault condition aboard a vehicle having a chassis, a pair of contactors, an energy storage system (ESS), a high-voltage bus, and at least one high-voltage component, the method comprising:
    measuring a first impedance level between the high-voltage bus and the chassis when the pair of contactors are in a closed state;
    commanding an opening of the pair of contactors;
    measuring a second impedance level between the high-voltage bus and the chassis after the pair of contactors are commanded open;
    comparing the first impedance level to the second impedance level; and
    executing a maintenance response aboard the vehicle in response to the first and the second impedance levels.

2. The method claim 1, wherein the high-voltage fault condition is selected from the group consisting of a welded contactor condition, an ESS isolation fault, and a disconnected component of the at least one high-voltage components.

3. The method of claim 2, wherein executing the maintenance response in response to the first and the second impedance levels includes setting an error code corresponding to a welded contactor condition when the second impedance level is less than a threshold multiple of the first impedance level.

4. The method of claim 3, wherein the threshold multiple is a value selected from the range of approximately 4 to 6.

5. The method of claim 1, wherein comparing the first impedance level to the second impedance level includes accessing a look-up table to thereby determine a fault state, the look-up table being indexed in part by a predetermined low range and a predetermined normal range of impedance values for each of the closed state and the open state.

6. The method of claim 5, wherein the predetermined normal range of impedance values corresponding to the closed state is approximately 0.8 to 1.5 mega Ohms and the predetermined normal range of impedance values corresponding to the open state is approximately 3 to 5 mega Ohms.

7. The method of claim 5, wherein accessing the look-up table to determine a fault state includes accessing a first portion of the look-up table to determine an ESS isolation fault, accessing a second portion of the look-up table to determine the welded contactor state, accessing a third portion of the look-up table to determine a vehicle isolation fault, and accessing a fourth portion of the look-up table to determine a no-fault condition.

8. A method for diagnosing a welded contactor condition in a vehicle having a chassis, a pair of contactors, an energy storage system (ESS), and a high-voltage bus, the method comprising:
    measuring a first electrical impedance level between the chassis and the high-voltage bus while the vehicle is running;
    commanding a shut-down of the vehicle;
    measuring a second electrical impedance level between the chassis and the high-voltage bus after the shut-down has been commanded;
    comparing the second electrical impedance level to the first electrical impedance level; and
    setting an error code aboard the vehicle corresponding to the welded contactor condition when a ratio of the second electrical impedance level to the first electrical impedance level is less than a threshold ratio.

9. The method of claim 8, wherein the threshold ratio is approximately 4:1 to 6:1.

10. The method of claim 8, wherein comparing the second electrical impedance level to the first electrical impedance level includes accessing a look-up table.

11. The method of claim 8, wherein setting an error code aboard the vehicle includes selecting from a plurality of different fault conditions as determined by the first and the second electrical impedance levels.

12. A vehicle comprising:
    a chassis;
    an energy storage system (ESS);
    at least one motor/generator;
    a high-voltage bus having a positive rail and a negative rail, the high-voltage bus being configured for conducting electrical current from the ESS to the at least one motor/generator;
    a first contactor that is electrically connected to the positive rail between the ESS and the at least one motor/generator;
    a second contactor being electrically connected to the negative rail between the ESS and the at least one motor/generator;
    a measurement device operable for measuring a total electrical impedance level between the chassis and each of the positive and negative rails; and
    a controller in electrical communication with the measurement device, and configured for determining a welded contactor condition of at least one of the first and the second contactor based on the total electrical impedance level.

13. The vehicle of claim 12, wherein at least one of the first and the second contactors is configured as a device selected from the group consisting of a single-pole/single-throw relay device and a solid-state switch.

14. The vehicle of claim 12, wherein the controller is adapted for selecting between one of a plurality of different fault conditions as determined by the total electrical impedance level.

15. The vehicle of claim 14, wherein the plurality of different fault conditions are selected from the group consisting of an ESS isolation fault condition, the welded contactor condition, a vehicle isolation fault condition, and a no-fault condition.

16. The vehicle of claim 15, wherein the plurality of different fault conditions are stored within a look-up table and are accessible by the controller.

* * * * *